(12) United States Patent
Genther et al.

(10) Patent No.: US 6,760,673 B2
(45) Date of Patent: Jul. 6, 2004

(54) METHOD AND APPARATUS FOR WAVEFORM MEASUREMENT INSTRUMENT

(75) Inventors: Scott Allan Genther, Colorado Springs, CO (US); Allen Montijo, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 43 days.

(21) Appl. No.: 10/209,018

(22) Filed: Jul. 31, 2002

(65) Prior Publication Data

US 2004/0024548 A1 Feb. 5, 2004

(51) Int. Cl.[7] .................. G01R 13/00; G01R 23/00
(52) U.S. Cl. .............. 702/75; 702/70; 324/121 R; 327/91
(58) Field of Search .............. 702/70–75; 324/121 R, 324/103 P; 341/155, 160; 345/440; 708/3, 313

(56) References Cited

U.S. PATENT DOCUMENTS

| | | | | |
|---|---|---|---|---|
| 4,183,087 A | * | 1/1980 | Huelsman | ............... 327/91 |
| 5,115,189 A | * | 5/1992 | Holcomb | ............... 324/121 R |
| 5,438,531 A | * | 8/1995 | Shank | ............... 708/313 |
| 5,740,064 A | * | 4/1998 | Witte et al. | ............... 702/70 |

* cited by examiner

Primary Examiner—John E. Barlow
Assistant Examiner—John Le (57) ABSTRACT

Sampling techniques and circuits for a waveform measuring instrument. The sampling techniques and circuits process a series of digital signal samples through a set of sample extractors and subsequently process the extracted digital signal samples. The set of sample extractors include a uniform decimator, a low frequency dither decimator, and a digital peak detector. The uniform decimator extracts a uniform decimated sample value for each decimated sample interval in a series of decimated sample intervals. The low frequency dither decimator extracts a low frequency dither decimated (random) sample value for each decimated sample interval in a series of decimated sample intervals. The digital peak detector extracts a maximum sample value and a minimum sample value for each decimated sample interval in the series of decimated sample intervals. The subsequent processing of the samples includes selecting samples from the set of extracted samples, storing the selected samples, retrieving the selected samples, potentially manipulating the selected samples mathematically or analytically interpreting the selected samples, and displaying the manipulated or analyzed sample values.

32 Claims, 7 Drawing Sheets

METHOD AND APPARATUS FOR WAVEFORM MEASUREMENT INSTRUMENT

FIELD OF THE INVENTION

This invention relates generally to the field of waveform measurement and sampling. More particularly, this invention relates to techniques and circuits for sampling waveforms in a waveform measurement instrument.

BACKGROUND OF THE INVENTION

The field of digitally sampled waveform measurement recognizes several issues that affect how a signal can be reconstructed, measured, and displayed after it has been sampled and stored. Some of these issues are aliasing, glitch detection, etc. Aliasing of a signal occurs when the frequency of sampling of a signal is less than twice the frequency of the highest frequency component of the signal, as proven by Nyquist, and results in improper reconstruction and frequency domain representation of the signal from its discrete time samples. Glitches can go undetected without sufficient measures to capture the glitch information.

One side effect of the requirement to sample a signal at twice its highest frequency is that a large amount of storage can be required. Solutions exist that reduce the storage requirement by selectively storing only some of the signal information that is sampled while still preserving much of the high frequency information. For example, for a given sample interval in time, an existing solution stores only the minimum signal value, the maximum signal value, and a decimated sample value for that interval. By storing only a minimum, maximum, and decimated sample for each time interval rather than storing each sample, the existing solution effectively reduces the amount of storage needed for each time interval to effectively reconstruct the signal.

The minimum and maximum values stored in each time interval assure that glitches can be reconstructed within the time interval. A decimated sample value can be a signal sample that is randomly chosen (dither decimated) from each time interval or a sample from the same position (uniform) in each time interval, but not both. When a uniform decimator is used, aliasing can result because of the reduced number of samples that the compression algorithm stores (for signal reconstruction, behaves like sampling at a lower frequency). When a dither decimator is used, aliasing is effectively reduced, but certain mathematical functions such as a Fast Fourier Transform (FFT) cannot be performed and others become computationally expensive. A FFT cannot be performed with a dither decimated sampling algorithm because the sampling interval must be uniform for this frequency based mathematical operation to be applicable.

BRIEF SUMMARY OF THE INVENTION

The present invention relates generally to techniques and circuits for digitally sampling waveforms in a waveform measurement instrument. Objects, advantages and features of the invention will become apparent to those skilled in the art upon consideration of the following detailed description of the invention.

A sampling technique for a waveform measuring instrument, consistent with certain embodiments of the present invention involves processing a series of digital signal samples through a uniform decimator to extract at least one uniform decimated sample value for each sample interval in a first series of sample intervals; processing the series of digital signal samples through a low frequency dither decimator to extract at least one low frequency dither decimated sample value for each sample interval in a second series of sample intervals; and processing the series of digital signal samples through a digital peak detector to extract a maximum sample value and a minimum sample value for each sample interval in the third series of sample intervals. In certain embodiments, the process further involves carrying out a reducing process by: processing the retrieved signal samples through a reducer uniform decimator to extract at least one uniform decimated sample value for each sample interval in a fourth series of sample intervals; processing the retrieved signal samples through a reducer low frequency dither decimator to extract at least one low frequency dither decimated sample value for each sample interval in a fifth series of sample intervals; and processing the retrieved signal samples through a reducer digital peak detector to extract a maximum sample value and a minimum sample value for each sample interval in a sixth series of sample intervals.

Many variations, equivalents and permutations of these illustrative exemplary embodiments of the invention will occur to those skilled in the art upon consideration of the description that follows. The particular examples above should not be considered to define the scope of the invention.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawing.

Figure 1:
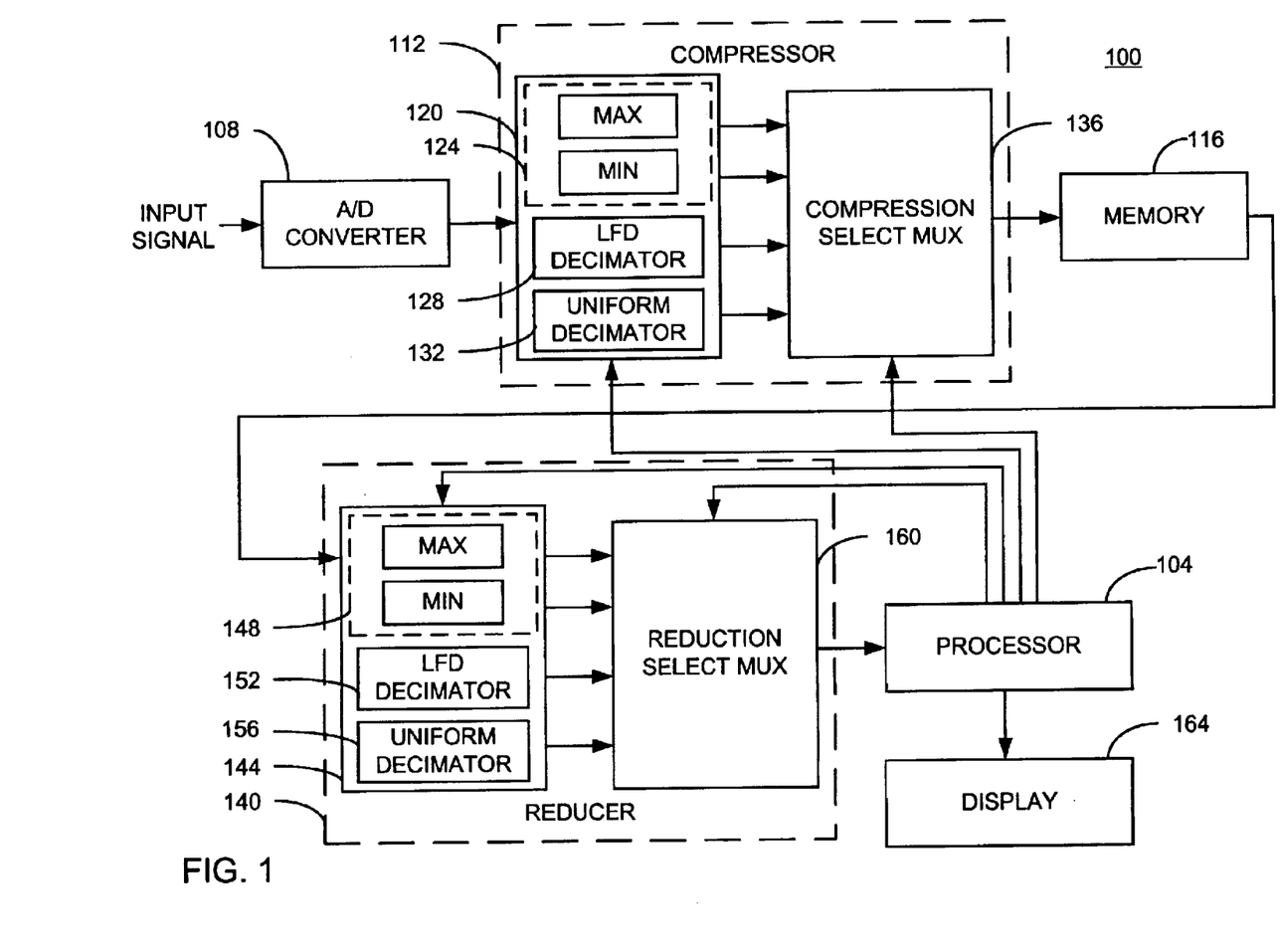
FIG. 1 is a block diagram of a waveform measurement instrument architecture consistent with certain embodiments of the present invention.

Turning now to FIG. 1, a waveform measurement instrument architecture 100 such as that used in a digital oscilloscope is shown. In this figure, processor 104 controls and manipulates the output of the various components of the architecture as described below. An input signal is converted to a digital representation with the use of the analog to digital (A/D) converter 108. Each sample produced by the A/D converter 108 represents a sample of the input signal at a specific sample time. The A/D converter 108 continuously produces samples taken at regular sampling intervals, forming a stream of digital signal samples, while the waveform measurement instrument architecture 100 is active.

A data compressor 112 operates over successive time intervals (decimated sample intervals) to reduce the amount of digital signal sample storage required by the waveform measurement instrument architecture 100. A time interval (decimated sample interval) can be thought of as a length of time over which the current compression activity operates. For purposes of this document, the time intervals for different types of decimation may or may not be the same size and may or may not be in phase. Moreover, adjacent intervals are not necessarily adjacent or non-overlapping (but can be). An acquisition time period can be thought of as the entire acquisition time that is divisible into a set of time intervals. The data compressor 112 reduces the number of digital signal samples over the acquisition time period that need to be stored to a memory 116 by selectively choosing certain samples from each time interval that will allow aliasing resistant reconstruction of the signal while also allowing glitch detection and mathematical functions to be performed on the reconstructed signal.

The data compressor 112 can store each sample produced by the A/D converter 108 during an acquisition time period into the memory 116, as-is and without manipulation, when the acquisition time and available storage make this possible. Otherwise, the data compressor 112 acts to enable capture of long acquisition records when the memory 116 is not large enough to hold all of the raw data that is obtained over the acquisition time period.

A digital sample extractor 120 is configured by the processor 104 to extract signal information over a time interval from the stream of digital signal samples produced by the A/D converter 108. The number of digital signal samples over which the digital signal extractor 120 operates for a given time interval is a function of the number of digital signal samples produced by the A/D converter 108 over that time interval (ultimately dictated by sampling rate). The digital signal extractor 120's components extract information from the set of sequential samples that represent the configured time interval, and repeat the process again for subsequent time intervals. The digital sample extractor 120 has a digital peak detector 124, a low frequency dither (LFD) decimator 128, and a uniform decimator 132. The digital peak detector 124 repeatedly selects the maximum and minimum signal sample values for the current time interval and can operate in an overlapped or non-overlapped manner. The low frequency dither (LFD) decimator 128 repeatedly selects a random sample from the current time interval using any suitable random or pseudo-random process. The uniform decimator 132 repeatedly selects a sample from a specific time point in the current time interval. The processor 104 controls the digital sample extractor 120 to identify the time interval over which to extract signal information.

For a sequence of time intervals of interest, aliasing resistant reconstruction of the signal, glitch detection (analytical interpretation of the sample value extremes against preset thresholds), and mathematical operations upon the reconstructed signal can be performed with the information represented by the minimum and maximum sample values, the dither decimated sample value, and the uniform decimated sample. By recognizing this fact, the invention uses the data compressor 112 to reduce the number of digital signal samples required for aliasing resistant reconstruction of the signal, glitch detection, and mathematical operations. Based upon the fact that the method uses four signal samples to represent a signal during a sample interval, any interval of larger than four samples in length can achieve a net reduction (compression) in its memory storage requirements.

The compression select multiplexer (MUX) 136 is configured by the processor 104. The compression select MUX 136 can store all four digital signal samples for each time interval to the memory 116 or it can be configured for further reductions in the amount of information storage for each time interval based upon intentions for the reconstructed signal. If, for example without limitation, at signal acquisition time the compression select MUX 136 is configured only to select the minimum and/or maximum (peak detect mode or glitch detect mode) of a signal during a given time interval, the compression select MUX 136 selects only the values generated by the digital peak detector 124. Likewise, if, at signal acquisition time, only a mathematical function (by way of a mathematical function selection) is intended, then the uniform decimator 132 output values are selected. Furthermore, if, at signal acquisition time, only an aliasing resistant reconstruction (no mathematical function selection) is intended then the LFD decimator 128 output values are selected. Under control of the processor 104, the data compressor 112, with the compression select MUX 136 can achieve even further reduction in the amount of storage required for a given time interval. The resultant set of digital signal samples is stored to the memory 116.

The memory 116 contains a compressed set of signal samples for the previous acquisition time period organized as smaller sets of signal samples for each time interval. A reducer 140 is used to retrieve the samples from memory 116, optionally further compress and/or select subsets by type, and present them for processing by the processor 104. Within the reducer 140, a memory parser 144 is configured by the processor 104 to interpret the formation of the sets of signal samples in the memory 116. The memory parser 144 also sequentially retrieves from memory 116 the signal samples for each successive time interval for the entire acquisition time period or a portion thereof.

Memory parser 144 of the reducer 140, parses the max and/or min values at reducer digital peak detector 148, the LFD decimated values at reducer LFD decimator 152, and the uniform decimated values at reducer uniform decimator 156 from memory 116 for a given time interval and supplies these values to the reduction select multiplexer (MUX) 160.

A reduction selection MUX 160 within the reducer 140 is configured by the processor 104 to allow a further reduction in each set of signal samples that is retrieved from memory 116 based upon the intended action to be performed upon the sequential sets of signal samples. This further reduction potentially allows for a reduced bandwidth requirement between the reducer 140 and the processor 104 in certain circumstances when all stored signal data for a given acquisition time period is not needed for the current processing requirements. As discussed above for the compression select MUX 136, the reduction selection MUX 160 can selectively pass through either the entire set of signal samples for each time interval or a subset of each set of signal samples. In any event, the processor 104 receives the signal samples for each time interval from the reducer 140, reconstructs the signal, and performs the intended functions on the reconstructed signal. Once the intended functions (e.g. math functions) have been performed on the reconstructed signal, the processor 104 passes the resulting signal representation to the display 164 for presentation.

The compressor 112 enables capture of long acquisition records when the memory is not large enough to hold all of the raw data that is obtained over the acquisition time. The reducer 140, on the other hand, carries out a similar function as the compressor 112, but to achieve a different objective. The reducer 140 provides fast processing of the stored data by "reducing" the amount of data that has to be transferred to the processor 104 using the same techniques as those used in the compressor 112. Whether the compression function is carried out in the reducer 140 or compressor 112, applying this algorithm to the stored data (as well as raw data) greatly speeds processing.

Stored data can be transferred from memory 116 directly to the processor 104 (and this is one mode of operation that is sometimes used) to render a display and/or perform mathematical operations on the data in any desired manner. However, the bandwidth of the processor 104 interface and processor computational speed is often limited such that processing of all stored data directly by the processor 104 can take an inordinate amount of time in deep memory systems. The reducer 140 addresses these limitations by (1) accessing the data at a speed very much greater than the processor 104 can by using dedicated and specialized digital hardware and (2) reducing (i.e. compressing) the stored data so that less has to be transferred to the processor 104, thus getting around the speed limitation of the processor interface. Both the compressor 112 and reducer 140 serve to "compress" the data. While the compressor 112 compresses to fit the data into available memory, the reducer 140 compresses so that less data have to be transferred to the processor 104. In addition, a hardware realization of the reducer 140 may be able to access memory 116 and perform its computations much faster than the processor 104 can do the equivalent.

The compressor 112 divides the input stream into time intervals and a dithered decimated value, uniform decimated value, and peak values are selected over each time interval and stored to achieve a net compression. As for the reducer 140, it takes the compressor 112 output (i.e. the data stored in memory 116) processes it in a manner similar to that used by the compressor 112 in processing raw data. In the simplest case the compressor 112 just stores the data as-is into memory 116 when the acquisition time and available storage make this possible. In this case, the reducer 140 uses the exact same algorithms as the compressor 112, since it is operating with raw data, and transfers compressed data sets to the processor 104. The point in doing this is to process data faster than the processor 104 can if it were to process the stored data directly. In addition, the reducer 140 can also leave the raw data unmolested so the processor 104 gets exactly the digitized samples. In other words, both the compressor 112 and reducer 140 have "do nothing to the data" modes where raw data are dealt with directly by the processor.

When the stored data are the compressed form, the reducer 140 can further reduce this data so that less data has to be transferred to the processor 104. This amounts to a recursive application of the compression algorithm. To accomplish this, the reducer 140 employs a modified version of the algorithm: First, as mentioned, the stored data is parsed so the reducer 140 can track which data are dither decimated, uniform decimated, minimums, and maximums. The reducer 140 can be set to pass only selected subsets of these types, per data set, and reduce the amount of data to be transferred to the processor 104. In addition, the reducer 140 can combine two or more adjacent stored data sets into one set, with all of the same types (and with the same meanings for the types) as the stored data, to deliver an even more compressed representation of all of the data represented by the multiple data sets that were combined. It does this by streaming the stored data sets to a machine that repeatedly combines every given number (N) of consecutive data sets into single data sets: For every N data sets input, one data set is output and transferred to the processor 104. The reducer algorithm for doing this varies from the compressor algorithm as follows:

For the further-compressed (i.e. reduced) uniform-decimated component, the reducer 140 chooses that same type and always chooses from the same data set within each N consecutive input data sets that are being combined into one data set.

For the further-compressed (i.e. reduced) dither-decimated component, the reducer chooses that same type randomly from any one of the N consecutive input data sets that are being combined into one data set For the further-compressed (i.e. reduced) minimum and maximum components, the reducer simply takes the minimum and maximum over the values of that same type across all N consecutive data sets being combined into one data set. (Actually, since the dither and uniform decimated values can never be smaller than the minimum in a data set, and they also cannot be larger than the maximum, the output minimum and maximum could be taken over all types instead of just the minimum and maximum types.)

While the reducer can further compress stored data, it can also simply pass the compressed stored data onto the processor which is a mode that is sometimes used depending on the purposes at hand.

It should be noted that at either the compression phase or the reduction phase, not all types need to be carried along depending upon the purposes at hand. The compressor 112 need not generate and store all types and likewise, the reducer 140 need not emit all types and can even discard some of the types that have been stored. Note, however, that if a type has not been stored the reducer 140 cannot recreate it. It should also be noted, that although the previous discussion covers the inclusion of zero or one uniform sample and zero or one dithered decimated sample, more than one uniform sample and/or more than one dither decimated sample can be generated and still be within the scope of the present invention. In fact, it may be advantageous to implement the present invention using an ASIC that has a mode where two uniform decimated samples are generated along with the minimum and maximum. Multiple uniform samples can be taken from evenly spaced locations across the interval and always from the same locations within each interval. For multiple dither decimated samples, the interval can be divided up into a number of equally sized subintervals, this number being equal to the number of dithered samples to generate, and a randomly chosen sample from within each subinterval is taken. This applies for both the compressor 112 and reducer 140. Those skilled in the art will appreciate, in view of this discussion, that there are other imaginable convolutions such as multiple pairs of peak values, etc.

It should also be noted that the compressor 112 operates in real time, and only gets one shot at the data. The reducer 140 operates in pseudo real time, i.e. it operates fast enough to give the user suitable throughput. Therefore, the reducer 140 may operate multiple times on a single stored set of data. In fact, it can operate on N different previously stored sets of data (acquisitions). Operating multiple times may be the result of the user changing the instrument set-up, for example, deciding to make a rise time measurement, turning on a function, or simply panning and/or zooming.

Given this teaching, a person skilled in the art will recognize that the list of possible functions that can be performed upon the reconstructed signal include, but are not limited to, simple math functions such as adding an offset (positive or negative), multiplying the signal by a constant, functional manipulation of the signal (e.g. fast Fourier transform (FFT)), measurement of signal characteristics, etc. Many other actions on the reconstructed signal are possible and should be considered within the scope of this invention.

Figure 2A:
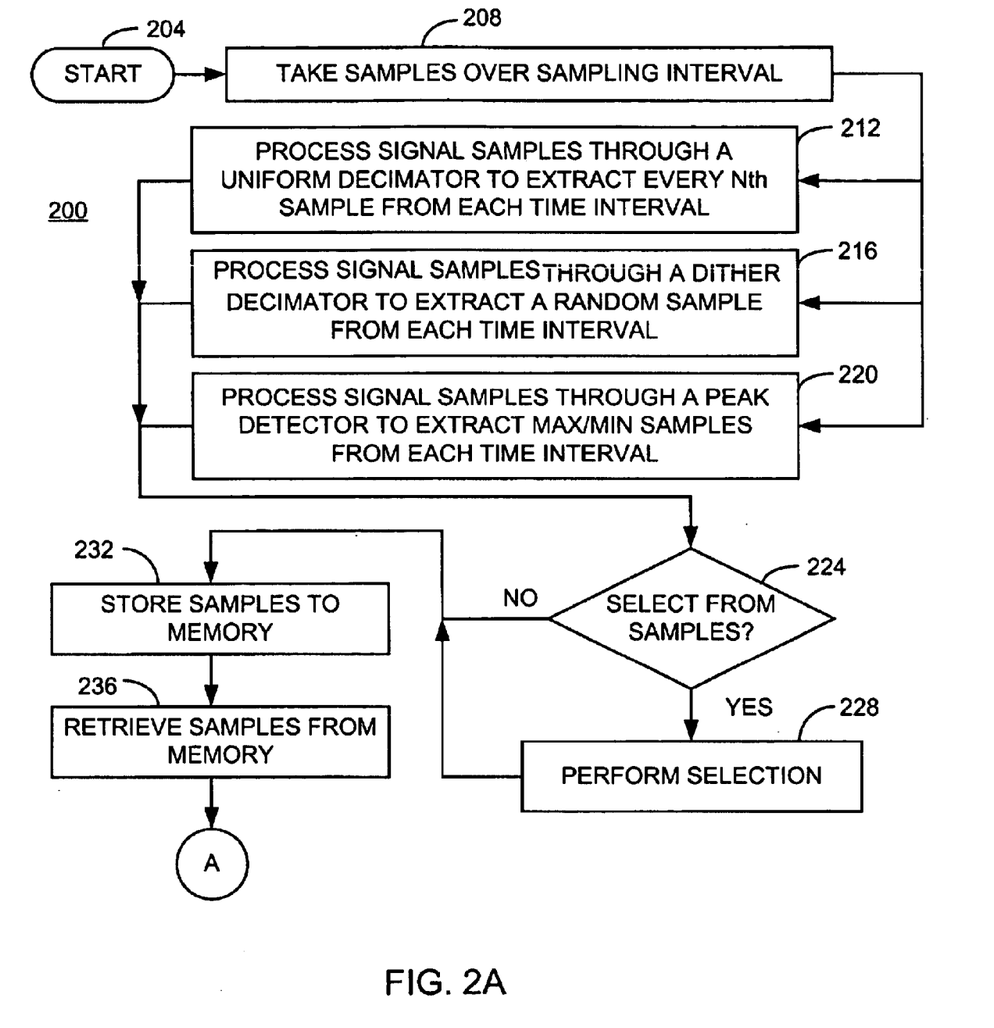
FIG. 2A is a first portion of a first flow chart of a waveform measurement instrument architecture consistent with certain embodiments of the present invention.
Figure 2B:
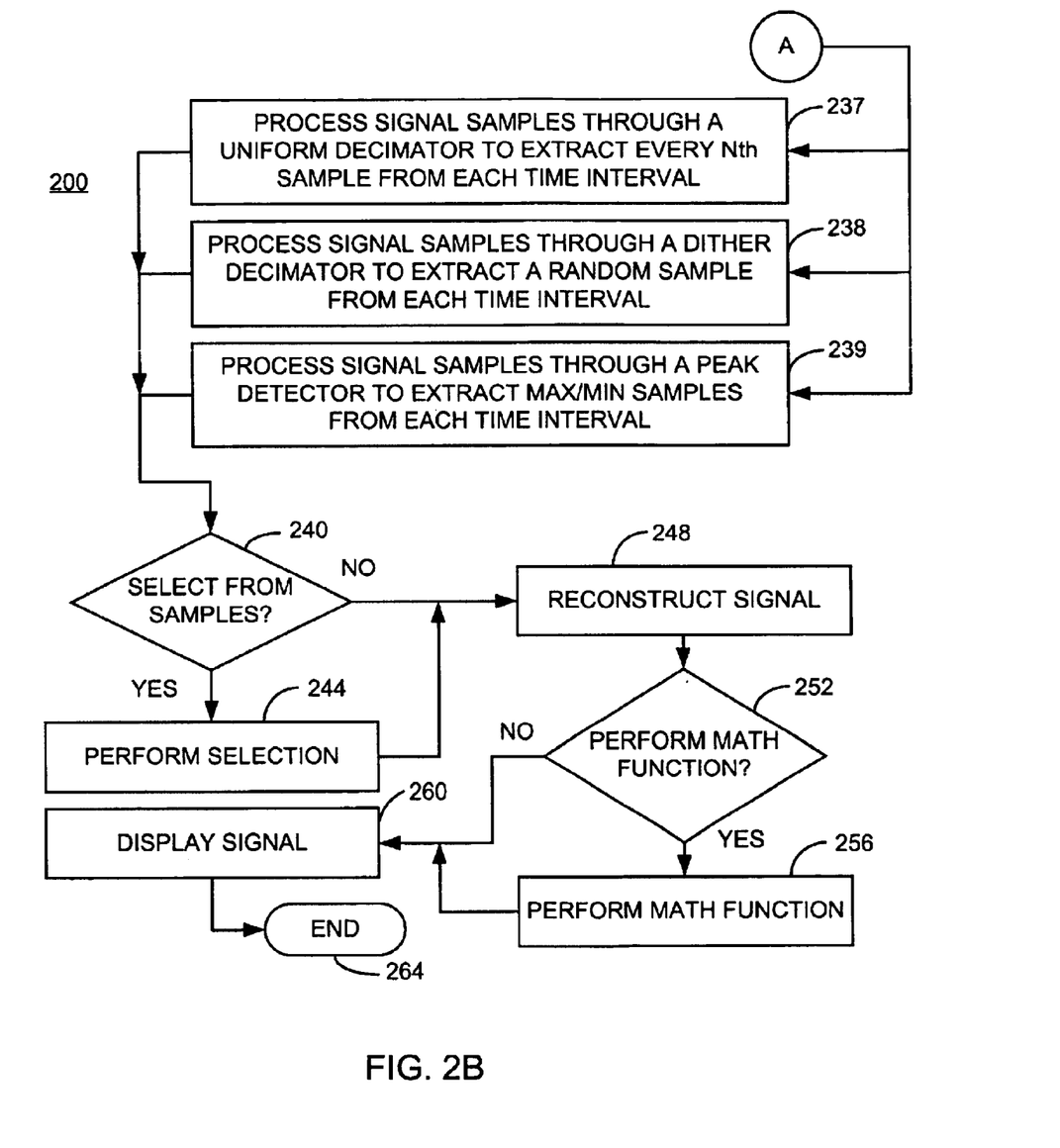
FIG. 2B is a second portion of a first flow chart of a waveform measurement instrument architecture consistent with certain embodiments of the present invention.

Turning now to FIG. 2, which is made up of FIG. 2A and FIG. 2B, a waveform measurement method 200 is shown. It may be helpful to refer to FIG. 1 for an architectural application of this method. This method starts at 204. At 208, digital signal samples are taken over a sampling time interval. At 212, the digital signal samples are processed through a uniform decimator to extract at least one sample from a specific position in every time interval. Simultaneously with 212, at 216, the digital signal samples are processed through a dither decimator to extract at least one sample randomly (i.e., at a randomly selected time within the interval) from the time interval. Likewise, at 220, simultaneously with 212 and 216, the digital signal samples are processed through a digital peak detector to extract minimum and maximum samples from the time interval. As discussed above, extracting this set of samples allows the potential for compression of the data, thereby reducing storage requirements of the method. As well, this approach preserves the ability to reduce aliasing in a reconstructed signal, while allowing glitch detection and mathematical functions to be performed on the reconstructed signal.

At 224 a decision is made about whether to use the raw data, all extracted samples or to select a subset for storage from the extracted samples. This determination is based upon the desired intent for the stored signal samples. Recalling the discussion in relation to the configuration select MUX 136 of FIG. 1, the possibilities for selection apply here as well. If a selection is intended from the extracted samples, this is done at 228.

Once the samples that are intended for storage have been selected, they are stored to a memory at 232. The stored samples (or raw data) are then available for processing and can be retrieved from memory at 236 for processing by reducer 140. In some instances, reducer 140 may simply pass the data from memory to the processor without further compression of the data. At 237, the digital signal samples are processed through a uniform decimator to allow the extraction of a sample from a specific position in every N time intervals retrieved from memory 116. Simultaneously with 237, at 238, the digital signal samples are processed through a dither decimator to allow the extraction of a sample randomly from every N time intervals. Likewise, at 239, simultaneously with 237 and 238, the digital signal samples are processed through a digital peak detector to allow the extraction of minimum and maximum samples from every N time intervals. As discussed above, extracting this set of samples allows the potential for compression of the data, thereby reducing the bandwidth requirements to the processor 104. As with the previous discussion, all samples can be passed through each of these portions of the process, or a subset may be passed through. If raw data was stored to memory 116 at 232 above, then raw data can be passed through at this point in the process as well.

At 240, a decision is made about whether to use all retrieved samples or to select a subset for processing from the retrieved samples. This determination is based upon the desired intent for the retrieved signal samples. Recalling the discussion in relation to the reduction select MUX 160 of FIG. 1, the possibilities for selection apply here as well. If a selection is intended from the retrieved samples, this is done at 244.

The selected retrieved samples are then used to reconstruct the signal at 248. At 252, a decision is made about whether to perform a mathematical function on the reconstructed signal. This decision block works in conjunction with the previous two decision blocks, 224 and 240, such that a uniform decimated sample is still present in the selection set of samples related to the reconstructed signal if a mathematical function is to be performed on the reconstructed signal.

If a mathematical function is to be performed, this is done at 256. As mentioned above, this mathematical function can be, by way of example without limitation, simple math functions such as adding an offset (positive or negative), multiplying the signal by a constant, functional manipulation of the signal (e.g. Fast Fourier Transform (FFT)), measurement of signal characteristics, etc. Many other actions on the reconstructed signal are possible and should be considered within the scope of this invention. At 260, the resultant waveform is displayed and the waveform measurement method 200 ends at 264.

Figure 3:
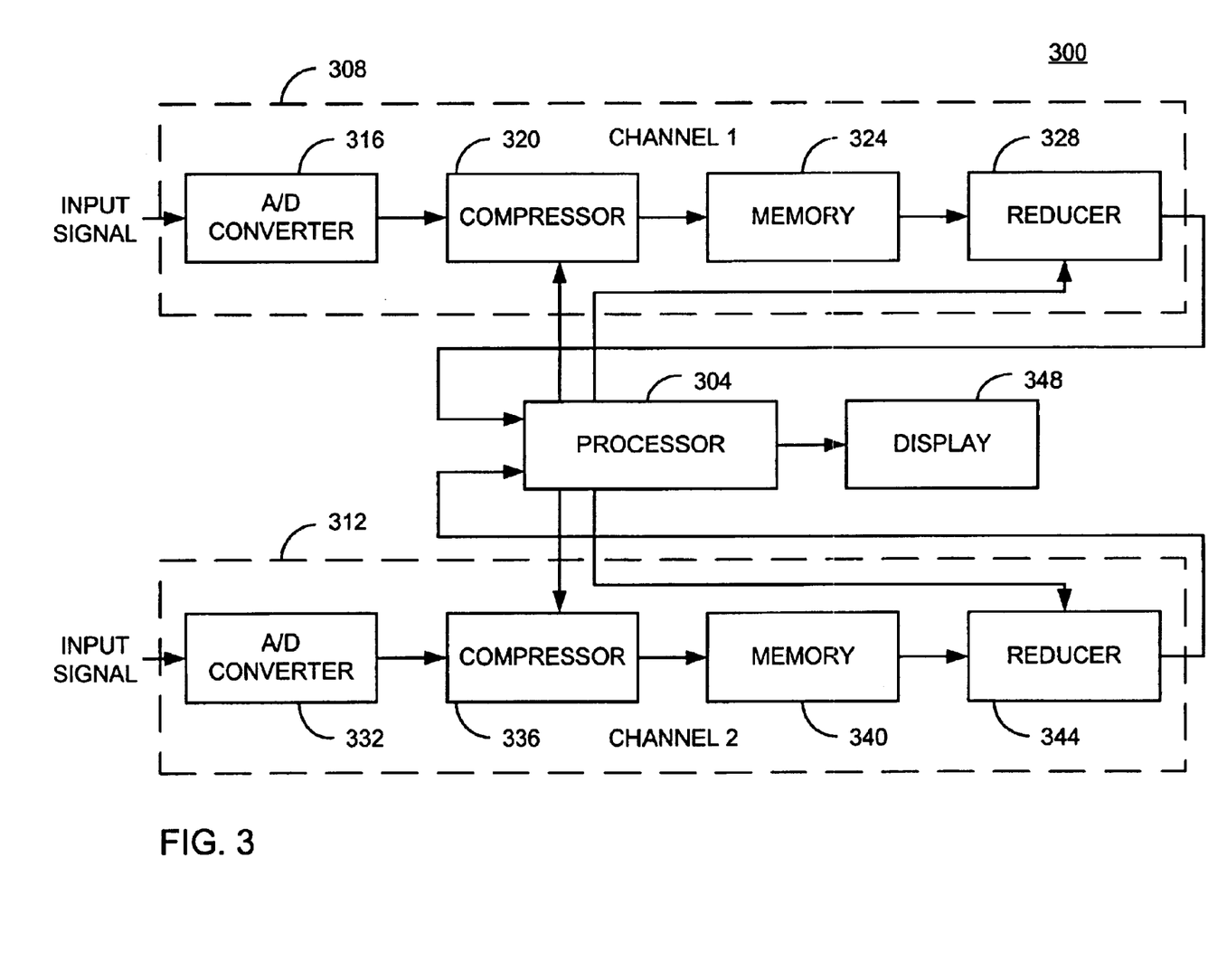
FIG. 3 is a block diagram of another waveform measurement instrument architecture consistent with certain embodiments of the present invention.

Turning now to FIG. 3, a waveform measurement instrument architecture 300 such as that used in a digital oscilloscope is shown. This figure represents a multi-channel architecture similar to the previously discussed waveform measurement instrument architecture 100 of FIG. 1. In this figure, processor 304 controls and manipulates the output of the various components of the multi-channel architecture as described below. Each channel in the waveform measurement instrument architecture 300 operates in a manner similar to that of waveform measurement instrument architecture 100 of FIG. 1 without the processor 104 and without the display 164. As such, when reference is made below to any components of a given channel, the reader can refer to the discussion above on waveform measurement instrument architecture 100 of FIG. 1 for specifics related to the components.

Architectural element 308 depicts channel 1, while 312 depicts channel 2 of the waveform measurement instrument architecture 300. It should be apparent to one skilled in the art that, upon consideration of this teaching, the multi-channel nature of this architecture can be extended beyond two channels without departure from the present invention. Two channels are discussed here for simplicity of presentation and this discussion is not intended to limit the invention as such.

An input signal is converted to a digital representation within 308 with the use of the analog to digital (A/D) converter 316. The output digital signal samples from the A/D converter 316 are available to the compressor 320. The compressor 320 operates under the control of the processor 304 to selectively store a reduced set of digital signal samples to the memory 324 based upon criteria discussed above. Under the control of the processor 304, the reducer 328 parses the stored digital signal samples from the memory 324 and further reduces the sample set transmitted to the processor 304 based upon criteria discussed above.

Similarly, an input signal is converted to a digital representation within 312 with the use of the analog to digital (A/D) converter 332. The output digital signal samples from the A/D converter 332 are available to the compressor 336. The compressor 336 operates under the control of the processor 304 to selectively store a reduced set of digital signal samples to the memory 340 based upon criteria discussed above. Under the control of the processor 304, the reducer 344 parses the stored digital signal samples from the memory 340 and further reduces the sample set transmitted to the processor 304 based upon criteria discussed above.

After the above-described sequence is completed for all channels of interest, the processor 304, reconstructs the signals for all channels. After all signals have been reconstructed, processor 304 further manipulates the reconstructed signals by implementing any mathematical functions or other processing that may be appropriate for the given situation. Given this teaching, a person skilled in the art will recognize that the list of possible functions that can be performed upon the pair (set) of reconstructed signals include, but are not limited to, simple math functions such as adding an offset to any or all signals (positive or negative), multiplying each signal by a constant, functional manipulation of the signals (e.g. Fast Fourier Transform (FFT)), measurement of signal characteristics, multiplication and other mathematical actions of the pair (set) of signals upon one another, etc. Many other actions on the pair (set) of reconstructed signals are possible and should be considered within the scope of this invention. At 348, the resultant signal(s) are displayed.

Figure 4A:
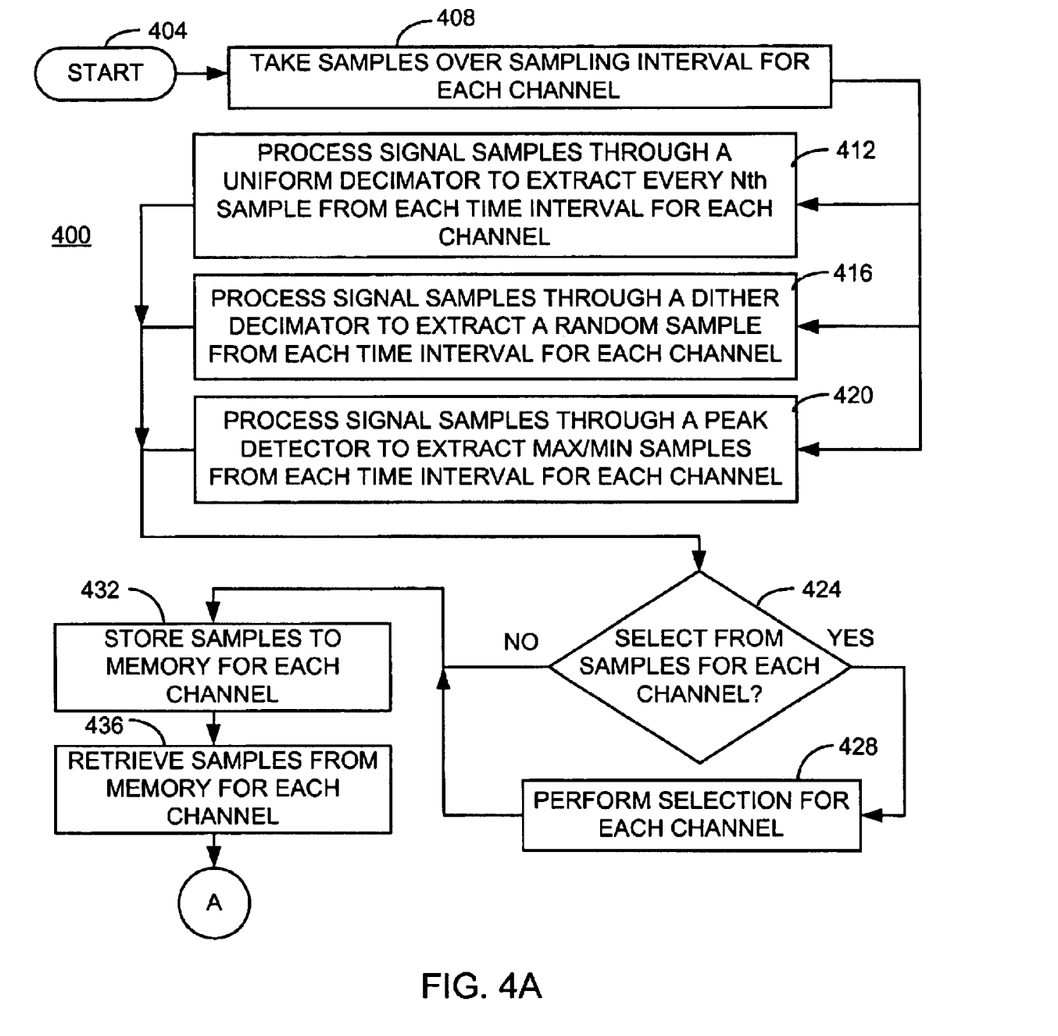
FIG. 4A is a first portion of a second flow chart of another waveform measurement instrument architecture consistent with certain embodiments of the present invention.
Figure 4B:
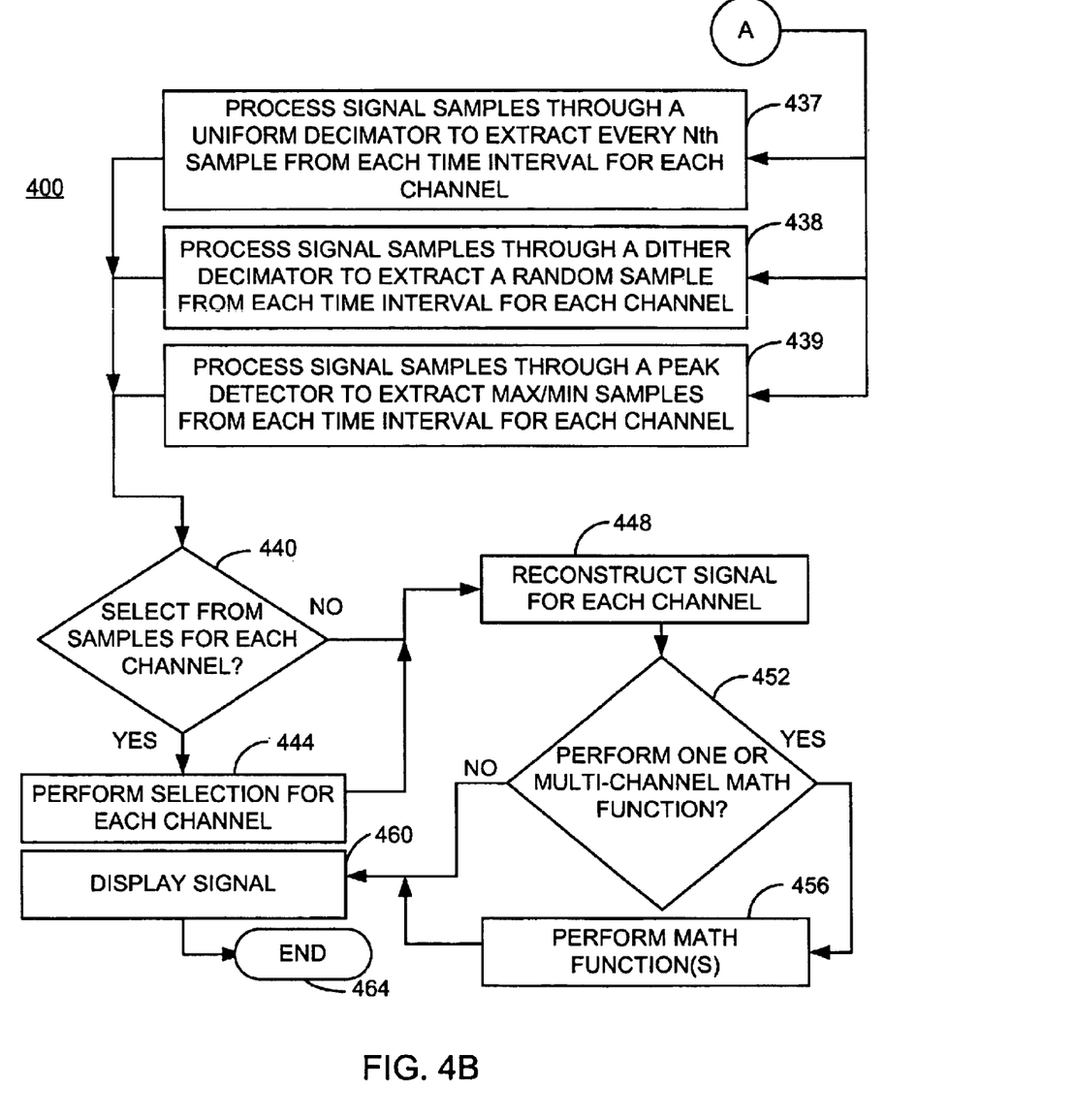
FIG. 4B is a second portion of a second flow chart of another waveform measurement instrument architecture consistent with certain embodiments of the present invention.

Turning now to FIG. 4, which is made up of FIG. 4A and FIG. 4B, a waveform measurement method 400 is shown. It may be helpful to refer to FIG. 3 for an architectural application of this method. This method is similar to waveform measurement method 200 except that this waveform measurement method 400 operates on multiple channels and differs in the mathematical processing steps. As such, when reference is made below to any elements of this waveform measurement method 400, the reader can refer to the discussion above on waveform measurement method 200 of FIG. 2 for specifics related to the elements.

This method starts at 404. At 408, digital signal samples are taken across all channels. At 412, the digital signal samples are processed through a uniform decimator to extract a sample from a specific position in every time interval for each channel. Simultaneously with 412, at 416, the digital signal samples are processed through a dither decimator to extract a sample randomly from the time interval for each channel. Likewise, at 420, simultaneously with 412 and 416, the digital signal samples are processed through a digital peak detector to extract minimum and maximum samples from the time interval for each channel. As discussed above, extracting this set of samples allows the potential for compression of the data, thereby reducing storage requirements of the method. As well, this approach preserves the ability to reconstruct an aliasing resistant signal, while allowing glitch detection and mathematical functions to be performed on the reconstructed signal.

At 424 a decision is made about whether to use all extracted samples or to select a subset for storage from the extracted samples for each channel. This determination is based upon the desired intent for the stored signal samples for each channel. Recalling the discussion in relation to the configuration select MUX 136 of FIG. 1, the possibilities for selection apply here as well. If a selection is intended from the extracted samples, this is done at 428 for each channel.

Once the samples that are intended for storage have been selected, they are stored to a memory at 432 for each channel. The stored samples are then available for processing and can be retrieved from memory at 436 for each channel. At 437, the digital signal samples are processed through a uniform decimator to allow the extraction of a sample from a specific position in every N time intervals retrieved from memory 116. Simultaneously with 437, at 438, the digital signal samples are processed through a dither decimator to allow the extraction of a sample randomly from every N time intervals. Likewise, at 439, simultaneously with 437 and 438, the digital signal samples are processed through a digital peak detector to allow the extraction of minimum and maximum samples from every N time intervals. As discussed above, extracting this set of samples allows the potential for compression of the data, thereby reducing the bandwidth requirements to the processor 104. As with the previous discussion, all samples can be passed through each of these portions of the process, or a subset may be passed through. If raw data were stored to memory 116 at 432 above, then raw data can be passed through at this point in the process as well.

At 440, a decision is made about whether to use all retrieved samples or to select a subset for processing from the retrieved samples for each channel. This determination is based upon the desired intent for the retrieved signal samples. Recalling the discussion in relation to the reduction select MUX 160 of FIG. 1, the possibilities for selection apply here as well. If a selection is intended from the retrieved samples, this is done at 444 for each channel.

The selected retrieved samples are then used to reconstruct the signal at 448 for each channel. At 452, a decision is made about whether to perform a mathematical function on the reconstructed signals. This decision block works in conjunction with the previous two decision blocks, 424 and 440, such that a uniform decimated sample is still present in the selection set of samples related to the reconstructed signals if mathematical functions are to be performed on the reconstructed signals.

If any mathematical functions are to be performed, they are done at 456. As mentioned above, the mathematical function(s) can be, by way of example without limitation, simple math functions such as adding an offset (positive or negative), multiplying the signal by a constant, functional manipulation of the signal (e.g. Fast Fourier Transform (FFT)), measurement of signal characteristics, etc., on each reconstructed signals. Many other actions on the reconstructed signals are possible and should be considered within the scope of this invention. Furthermore, in this waveform measurement method 400, independent operations on each reconstructed signal are possible as in waveform measurement method 200, along with additional mathematical functions including inter-operation upon the reconstructed signals of the multiple channels. It should be apparent to one skilled in the art, upon consideration of this teaching, that multiple signal addition, multiple signal subtraction, multiple signal multiplication, and many other mathematical multiple signal operations can be performed on the multiple reconstructed signals in this waveform measurement method 400. At 460, the resultant waveform is displayed and the waveform measurement method 400 ends at 464.

Figure 5:
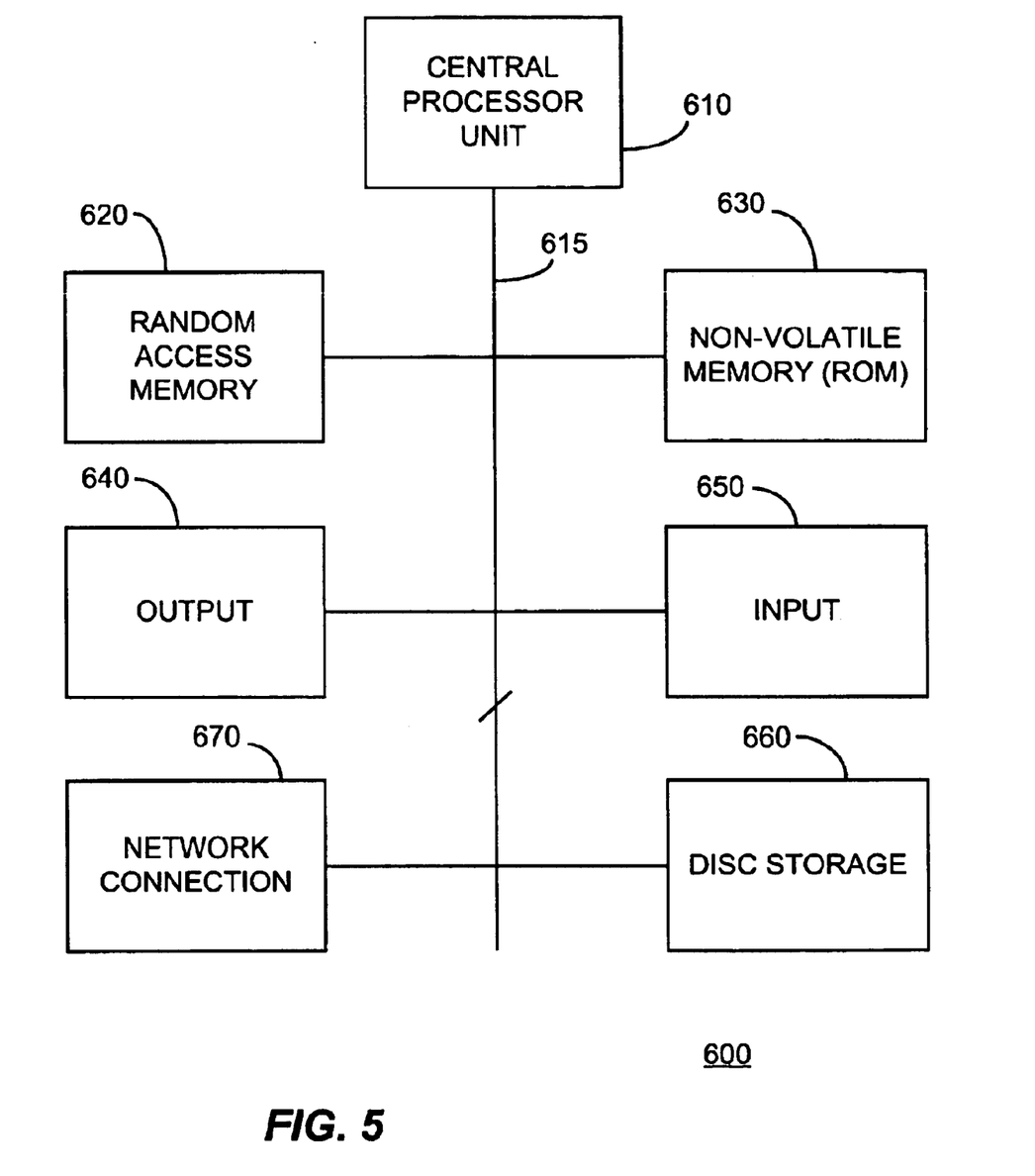
FIG. 5 is a computer system consistent with certain embodiments of the present invention.

The processes previously described can be carried out on a programmed general purpose computer system, such as the exemplary computer system 600 depicted in FIG. 5. Computer system 600 has a central processor unit (CPU) 610 with an associated bus 615 used to connect the central processor unit 610 to Random Access Memory 620 and/or Non-Volatile Memory 630 in a known manner. An output mechanism at 640 may be provided in order to display and/or print output for the computer user. Similarly, input devices such as keyboard and mouse 650 may be provided for the input of information by the computer user. Computer system 600 also may have disc storage 660 for storing large amounts of information including, but not limited to, program files and data files. Computer system 600 may be coupled to a local area network (LAN) and/or wide area network (WAN) and/or the Internet using a network connection 670 such as an Ethernet adapter coupling computer system 600, possibly through a firewall.

Those skilled in the art will recognize that the present invention has been described in terms of exemplary embodiments based upon use of a programmed processor. However, the invention should not be so limited, since the present invention could be implemented using hardware component equivalents such as special purpose hardware and/or dedicated processors which are equivalents to the invention as described and claimed. Similarly, general purpose computers, microprocessor based computers, microcontrollers, optical computers, analog computers, dedicated processors and/or dedicated hard wired logic may be used to construct alternative equivalent embodiments of the present invention.

Those skilled in the art will appreciate that the program steps and associated data used to implement the embodiments described above can be implemented using disc storage as well as other forms of storage such as for example Read Only Memory (ROM) devices, Random Access Memory (RAM) devices; optical storage elements, magnetic storage elements, magneto-optical storage elements, flash memory, core memory and/or other equivalent storage technologies without departing from the present invention. Such alternative storage devices should be considered equivalents.

The present invention, as described in embodiments herein, is implemented using a programmed processor executing programming instructions that are broadly described above in flow chart form that can be stored on any suitable electronic storage medium or transmitted over any suitable electronic communication medium. However, those skilled in the art will appreciate that the processes described above can be implemented in any number of variations and in many suitable programming languages without departing from the present invention. For example, the order of certain operations carried out can often be varied, additional operations can be added or operations can be deleted without departing from the invention. Error trapping can be added and/or enhanced and variations can be made in user interface and information presentation without departing from the present invention. Such variations are contemplated and considered equivalent.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications, permutations, and variations as fall within the scope of the appended claims.

What is claimed is:

1. A sampling technique for a waveform measuring instrument, comprising:
processing a series of digital signal samples through a uniform decimator to extract at least one uniform decimated sample value for each sample interval in a first series of sample intervals;
processing the series of digital signal samples through a low frequency dither decimator to extract at least one low frequency dither decimated sample value for each sample interval in a second series of sample intervals; and
processing the series of digital signal samples through a digital peak detector to extract a maximum sample value and a minimum sample value for each sample interval in the third series of sample intervals.

2. A sampling technique for a waveform measuring instrument as in claim 1, wherein said sample intervals in said first, second, and third series of sample intervals are in phase.

3. A sampling technique for a waveform measuring instrument as in claim 1, wherein said sample intervals in said first, second, and third series of sample intervals are overlapping.

4. A sampling technique for a waveform measuring instrument as in claim 1, wherein said sample intervals in said first, second, and third series of sample intervals are the same size.

5. A sampling technique for a waveform measuring instrument as in claim 1, wherein said sample intervals in said first, second, and third series of sample intervals are different sizes.

6. A sampling technique for a waveform measuring instrument as in claim 1, wherein said sample intervals in said first, second, and third series of sample intervals are out of phase.

7. A sampling technique for a waveform measuring instrument as in claim 1, further comprising for each sample interval storing at least one of:
said uniform decimated sample value;
said low frequency dither decimated sample value;
said maximum sample value and said minimum sample value; and
said series of digital signal samples.

8. A sampling technique for a waveform measuring instrument as in claim 7, further comprising for each sample interval, retrieving at least one of:
said stored uniform decimated sample value;
said stored low frequency dither decimated sample value;
said stored maximum sample value and said minimum sample value; and
said series of digital signal samples.

9. A sampling technique for a waveform measuring instrument as in claim 8, further comprising carrying out a reducing process by:
processing said retrieved signal samples through a reducer uniform decimator to extract at least one uniform decimated sample value for each sample interval in a fourth series of sample intervals;
processing said retrieved signal samples through a reducer low frequency dither decimator to extract at least one low frequency dither decimated sample value for each sample interval in a fifth series of sample intervals; and
processing said retrieved signal samples through a reducer digital peak detector to extract a maximum sample value and a minimum sample value for each sample interval in a sixth series of sample intervals.

10. A sampling technique for a waveform measuring instrument as in claim 9, wherein said sample intervals in said fourth, fifth, and sixth series of sample intervals are in phase.

11. A sampling technique for a waveform measuring instrument as in claim 9, wherein said sample intervals in said fourth, fifth, and sixth series of sample intervals are overlapping.

12. A sampling technique for a waveform measuring instrument as in claim 9, wherein said sample intervals in said fourth, fifth, and sixth series of sample intervals are the same size.

13. A sampling technique for a waveform measuring instrument as in claim 9, wherein said sample intervals in said fourth, fifth, and sixth series of sample intervals are different sizes.

14. A sampling technique for a waveform measuring instrument as in claim 9, wherein said sample intervals in said fourth, fifth, and sixth series of sample intervals are out of phase.

15. A sampling technique for a waveform measuring instrument as in claim 9, further comprising for each sample interval:
  if a mathematical function is selected, performing said selected mathematical function on said extracted uniform decimated sample value to create a modified uniform decimated sample value and displaying said modified uniform decimated sample value on a display; and
  if a glitch detection mode is active, displaying said extracted maximum sample value and said minimum sample value on a display.

16. A sampling technique for a waveform measuring instrument as in claim 1, further comprising for each sample interval:
  if a mathematical function is selected, storing said uniform decimated sample value; and
  if a glitch detection mode is active, storing said maximum sample value and said minimum sample value.

17. A sampling technique for a waveform measuring instrument as in claim 16, further comprising for each sample interval:
  if a mathematical function is selected, retrieving said stored uniform decimated sample value; and
  if said glitch detection mode is active, retrieving said stored maximum sample value and said minimum sample value.

18. A sampling technique for a waveform measuring instrument as in claim 17, further comprising for each sample interval:
  if a mathematical function is selected, performing said selected mathematical function on said retrieved uniform decimated sample value to create a modified uniform decimated sample value and displaying said modified uniform decimated sample value on a display; and
  if said glitch detection mode is active, displaying said retrieved maximum sample value and said minimum sample value on a display.

19. An electronic storage medium storing instructions which, when carried out on a programmed processor, carry out a sampling technique for a waveform measuring instrument, comprising:
  processing a series of digital signal samples through a uniform decimator to extract at least one uniform decimated sample value for each sample interval in a first series of decimated sample intervals;
  processing the series of digital signal samples through a low frequency dither decimator to extract at least one low frequency dither decimated sample value for each decimated sample interval in a second series of sample intervals; and
  processing the series of digital signal samples through a digital peak detector to extract a maximum sample value and a minimum sample value for each decimated sample interval in a third series of sample intervals.

20. A multi-channel sampling technique for a waveform measuring instrument, comprising for each channel:
  processing a series of digital signal samples through a uniform decimator to extract at least one uniform decimated sample value for each decimated sample interval in a first series of sample intervals;
  processing the series of digital signal samples through a low frequency dither decimator to extract at least one low frequency dither decimated sample value for each decimated sample interval in a second series of sample intervals; and
  processing the series of digital signal samples through a digital peak detector to extract a maximum sample value and a minimum sample value for each decimated sample interval in a third series of sample intervals.

21. A multi-channel sampling technique for a waveform measuring instrument as in claim 20, further comprising for each channel and for each sample interval storing at least one of:
  said uniform decimated sample value;
  said low frequency dither decimated sample value;
  said maximum sample value and said minimum sample value; and
  said series of digital samples.

22. A multi-channel sampling technique for a waveform measuring instrument as in claim 21, further comprising for each channel and for each sample interval retrieving at least one of:
  said stored uniform decimated sample value;
  said stored low frequency dither decimated sample value;
  said stored maximum sample value and said minimum sample value; and
  said series of digital samples.

23. A multi-channel sampling technique for a waveform measuring instrument as in claim 22, further comprising for each channel and for each sample interval:
  if a mathematical function is selected, performing said selected mathematical function on said retrieved uniform decimated sample values to create modified uniform decimated sample values and displaying said modified uniform decimated sample values on a display;
  if a multi-channel mathematical function is selected, performing said selected multi-channel mathematical function on said uniform decimated sample values for each channel selected for said multi-channel mathematical function to create multi-channel modified uniform decimated sample values and displaying said multi-channel modified uniform decimated sample values on a display; and
  if a glitch detection mode is active, displaying said retrieved maximum sample values and said minimum sample values on a display.

24. A multi-channel sampling technique for a waveform measuring instrument as in claim 20, further comprising for each channel and for each sample interval:
  if a mathematical function is selected, storing said uniform decimated sample values;
  if a multi-channel mathematical function is selected, storing said uniform decimated sample values; and
  if a glitch detection mode is active, storing said maximum sample values and said minimum sample values.

25. A multi-channel sampling technique for a waveform measuring instrument as in claim 24, further comprising for each channel and for each sample interval:
- if a mathematical function is selected, retrieving said stored uniform decimated sample values;
- if a multi-channel mathematical function is selected, retrieving said stored uniform decimated sample values; and
- if said glitch detection mode is active, retrieving said stored maximum sample value and said minimum sample values.

26. A multi-channel sampling technique for a waveform measuring instrument as in claim 25, further comprising for each channel and for each sample interval:
- if a mathematical function is selected, performing said selected mathematical function on said retrieved uniform decimated sample values to create modified uniform decimated sample values and displaying said modified uniform decimated sample values on a display;
- if a multi-channel mathematical function is selected, performing said selected multi-channel mathematical function on said uniform decimated sample values for each channel selected for said multi-channel mathematical function to create multi-channel modified uniform decimated sample values and displaying said multi-channel modified uniform decimated sample values on a display; and
- if said glitch detection mode is active, displaying said retrieved maximum sample values and said minimum sample values on a display.

27. A sampling technique for a waveform measuring instrument as in claim 20, further comprising carrying out a reducing process by:
- processing said retrieved signal samples through a reducer uniform decimator to extract at least one uniform decimated sample value for each sample interval in a fourth series of sample intervals;
- processing said retrieved signal samples through a reducer low frequency dither decimator to extract at least one low frequency dither decimated sample value for each sample interval in a fifth series of sample intervals; and
- processing said retrieved signal samples through a reducer digital peak detector to extract a maximum sample value and a minimum sample value for each sample interval in a sixth series of sample intervals.

28. A sampling circuit in a waveform measuring instrument, comprising:
- a digital peak detector receiving a stream of digital signal samples and producing a maximum sample value output and a minimum sample value output for each sample interval of a series of digital signal samples;
- a low frequency dither decimator receiving said stream of digital signal samples and producing a low frequency dither decimated sample value output for each sample interval of the series of digital signal samples; and
- a uniform decimator receiving said stream of digital signal samples and producing a uniform decimated sample value output for each sample interval of the series of digital signal samples.

29. A sampling circuit in a waveform measuring instrument as in claim 28, further comprising:
- an A/D converter receiving an analog signal input and producing said stream of digital signal samples;
- a memory that stores at least one of said maximum and minimum sample value outputs, said uniform decimated sample value output, and said low frequency dither decimated sample value output;
- a compression select multiplexer for selecting at least one of said outputs of said digital peak detector, said uniform decimator, and said low frequency dither decimator for storage to said memory;
- a memory parser for retrieving at least one of said stored digital peak detector, said uniform decimator, and said low frequency dither decimator outputs from said memory;
- a reduction select multiplexer for selecting at least one of said retrieved outputs of said digital peak detector, said uniform decimator, and said low frequency dither decimator; and
- a display that displays graphical representation of one of said maximum and minimum sample value outputs, said uniform decimated sample value output, and said low frequency dither decimated sample value output.

30. A waveform measuring instrument, comprising:
- an A/D converter receiving an analog signal input and producing a digital signal sample output;
- a digital peak detector receiving an input derived from the A/D converter's digital signal sample output, and producing a maximum sample value output, and a minimum sample value output;
- a uniform decimator receiving an input derived from the A/D converter's digital signal sample output, and producing a uniform decimated sample value output;
- a low frequency dither decimator receiving an input derived from the A/D converter's digital signal sample output, and producing a low frequency dither decimated sample value output;
- a memory that stores at least one of said maximum and minimum sample value outputs, said uniform decimated sample value output, and said low frequency dither decimated sample value output; and
- a display that displays graphical representation of one or more of said maximum and minimum sample value outputs, said uniform decimated sample value output, and said low frequency dither decimated sample value output.

31. A waveform measuring instrument as in claim 30, further comprising a compression select multiplexer for selecting at least one of the outputs of said digital peak detector, said uniform decimator, and said low frequency dither decimator for storage to said memory.

32. A waveform measuring instrument as in claim 31, further comprising a memory parser for retrieving at least one of said stored digital peak detector, said uniform decimator, and said low frequency dither decimator outputs from said memory, and a reduction select multiplexer for selecting at least one of said retrieved outputs of said digital peak detector, said uniform decimator, and said low frequency dither decimator.

* * * * *